United States Patent

Okada et al.

[11] Patent Number: 6,098,809
[45] Date of Patent: Aug. 8, 2000

[54] STORAGE CONTAINER FOR PRECISION SUBSTRATES

[75] Inventors: Kazuya Okada, Itoigawa; Tatsuaki Hirohata, Nishishirakawa-gun, both of Japan

[73] Assignees: Shin-Etsu Polymer Co., Ltd.; Shin-Etsu Handotai Co., Ltd., both of Tokyo, Japan

[21] Appl. No.: 09/347,252

[22] Filed: Jul. 2, 1999

[30] Foreign Application Priority Data

Jul. 7, 1998 [JP] Japan .................... 10-191512

[51] Int. Cl.⁷ .................................... B65D 85/48
[52] U.S. Cl. .................. 206/711; 206/232; 206/454
[58] Field of Search ..................... 206/710–712, 206/454, 455, 232, 459.5, 832; 40/312, 654.01; 248/213.2, 220.21, 223.41

[56] References Cited

U.S. PATENT DOCUMENTS

| 5,669,508 | 9/1997 | Chen et al. | 206/710 |
| 5,678,693 | 10/1997 | Tapp et al. | 206/454 |
| 5,755,332 | 5/1998 | Holliday et al. | 206/711 |
| 5,915,562 | 6/1999 | Nyseth et al. | 206/710 |

FOREIGN PATENT DOCUMENTS

| 64-48032 | 3/1987 | Japan . |
| 63-500691 | 3/1988 | Japan . |
| 5-50740 | 7/1993 | Japan . |
| 6-38443 | 5/1994 | Japan . |
| 6-77247 | 10/1994 | Japan . |
| 7-46694 | 5/1995 | Japan . |
| 8-279546 | 10/1996 | Japan . |
| WO86/00870 | 2/1986 | WIPO . |
| WO87/01361 | 3/1987 | WIPO . |
| WO87/04043 | 7/1987 | WIPO . |

*Primary Examiner*—Paul T. Sewell
*Assistant Examiner*—Luan K. Bui
*Attorney, Agent, or Firm*—Darby & Darby

[57] ABSTRACT

A storage container for precision substrates comprising: an opening front face of a pod case for aligning and accommodating a plurality of wafers is covered with a pod door, a bottom plate attached to a bottom face of the pod case, and a pocket body integrally formed at the other end of the bottom plate and adjacent to the back face of the pod case in a standing condition. An identification plate for wafers is detachably inserted into the pocket. Since there is no need of peeling off an identification code seal from the storage container for precision substrates, contamination of the wafer can be prevented.

4 Claims, 13 Drawing Sheets

STORAGE CONTAINER FOR PRECISION SUBSTRATES

BACKGROUND OF THE INVENTION (1) Field of the Invention

The present invention relates to a storage container for precision substrates which accommodates, stores, transfers, carries or transports semiconductor wafers or precision substrates such as mask glasses, and can be connected to a standardized mechanical interface apparatus for machining precision substrates (SMIF: Standard Mechanical Interface) or FIMS (Front-opening interface Mechanical Standard).

(2) Description of the Prior Art

Conventional storage containers for precision substrates comprise, as shown in FIG. 1 and FIG. 2, a pod case 1 for accommodating a plurality of semiconductor wafers (hereinafter, referred to as "wafers"), a pod door 12 for detachably covering the front opening of the pod case 1, and a bottom plate 23 attached to the bottom face of the pod case 1. The pod case 1 is formed in a front-opening box structure, with a plurality of engagement holes 6 formed on the upper and lower sides of the front inner periphery, respectively. A rear retainer 7 is attached on the inner back face of the pod case 1, and opposed substrate supports 8 are respectively attached on the inside both sides, these rear retainer 7, and a pair of substrate supports 8 aligning a plurality of wafers W in the vertical direction.

The pod door 12 has an opening/closing lock mechanism 15 built therein for vertically moving a plurality of latch plates 21 based on the rotation operation of disks 19. Each latch plate 21 of the opening/closing lock mechanism 15 has an engagement pawl 22 formed thereon which appears and disappears from/to a through hole 12a on the pod door 12. Each engagement pawl 22 fits and engages with each engagement hole 6, thereby the pod door 12 is firmly fitted and attached on the front of the pod case 1 so as to cover the front face.

In the above configuration, when wafers W are accommodated, a plurality of wafers W are aligned and accommodated in the pod case 1, and the pod door 12 is fitted to the opening front face of the pod case 1, as well as the opening/closing lock mechanism 15 is operated to be locked by means of unillustrated pod opener, hence the plurality of wafers W are accommodated in the storage container for precision substrates in an airtight condition.

Moreover, when the wafers W are to be processed, the storage container for precision substrates is positioned and set, for example, on a carrier stage of unillustrated handling apparatus, together with unillustrated open cassette. Then, the opening/closing lock mechanism 15 on the pod door 12 is operated to be released by means of the pod opener to detach the pod door 12 from the opening front of the pod case 1. After the storing state or the like of the plurality of wafers W is confirmed, they are pulled out from the bottom in turn by a transfer mechanism of the handling apparatus, and transferred to an open cassette of the other carrier stage from the bottom.

In processing and machining of the wafers W, it is necessary to accurately identify and recognize the information regarding the variety of wafers W and the storage container for precision substrates. To realize this identification, as shown in FIG. 3 and FIG. 4, there has been conventionally adopted a method of either (1) adhering an identification code seal 37 on the back of the pod case 1, or (2) integrally forming a pocket on the back of the pod case 1 and putting an identification plate 29 in the pocket 38.

As this type of related prior arts, there can be mentioned Japanese Utility Model Application Laid-open Hei 6 No. 77247, Japanese Utility Model Application Laid-open Hei 5 No. 50740, Japanese Utility Model Application Laid-open Sho 64 No. 48032, Japanese Patent Application Disclosure Sho 61 No. 502994, Japanese Patent Application Disclosure Sho 63 No. 503259, Japanese Patent Application Disclosure Sho 63 No. 500691, Japanese Patent Publication Hei 6 No. 38443, Japanese Patent Publication Hei 7 No. 46694, and Japanese Patent Application Laid-open Hei 8 No.279546.

With the conventional storage container for precision substrates, the wafers W and the storage container for precision substrates are identified in the manner as described above. Either method may be adopted, however, there have been various problems as described below. First, in the method (1), when the storage container for precision substrates is cleaned or rinsed, the wafers W are likely to deteriorate its quality due to the influence of an adhering agent. As a measure against the quality deterioration, there can be considered a method that the cleaning time is extended, or inferior products are rejected. With this method, however, there is caused another problem that the productivity drops. Moreover, when the storage container for precision substrates is collected, cleaned and reused, the number of process is increased for putting new identification code seals 37 using the adhering agent, and the cleaning time tends to become long.

In the case of the method (2), since the pod case 1 and the pocket 1 are integrally formed, there are such problems that the structure of the mold becomes very complicated, and the cost cannot be maintained or controlled. Moreover, when the storage container for precision substrates is injection-molded, the back face of the pod case 1 forms a portion where a gate is provided. Therefore, molding the pocket 38 in this portion leads to restriction of the position of the gate or decrease in the number of gates, making the molding condition worse. Furthermore, in molding the pocket 38, it has to be constructed in a nesting structure with the mold being a separate part, which leads another problems that cooling becomes instable, and that inferior products may be produced.

Furthermore, when a plate holding portion of the pocket 38 is molded, it causes resistance when the formed article is released from the mold. Therefore, it is necessary to attach a slide mechanism in the nesting portion where the plate holding portion is formed to release the plate holding portion from the molded article to remove the resistance. In this case, the slide mechanism is likely to be affected by the heat of the resin to be filled, due to its position near the gate. Hence, there is caused another problem that the slide mechanism may malfunction due to the thermal expansion or the like to decrease the durability.

SUMMARY OF THE INVENTION

The present invention has been completed under this background. It is an object of the present invention to provide a storage container for precision substrates which can prevent contamination of precision substrates and drop in the productivity, and can maintain the quality of precision substrates. Moreover, it is another object of the present invention to provide a storage container for precision substrates which can prevent complication of the mold structure, instability of cooling and occurrence of inferior products, when it is produced by molding.

With a view to attaining the above objects, the present invention provides a storage container for precision substrates comprising: one opening end face of a pod case for accommodating precision substrates is covered with a pod door, a bottom plate provided on a bottom face of the pod case, and a pocket body provided on the bottom plate and located at the other end portion of the pod case, wherein the pocket body holds an identification medium for the precision substrates.

Preferably the pocket body is formed in a substantially box shape with the upper face being opened, and a reading area for the identification medium is formed in the standing plane thereof.

Preferably the bottom plate and the pocket body are made separate bodies, and the pocket body is detachably disposed to the bottom plate.

The pocket body may be arranged in a standing condition at the other end portion of the bottom plate.

A guide rail may be provided at least in a periphery of the other end portion of the bottom plate, and a fitting groove is provided in the pocket body, so that the guide rail is engaged with the fitting groove to arrange the pocket in a standing condition.

The pocket body may be provided with a fitting groove which is able to be attached shiftably to the guide rail, and the fitting groove is further provided with a fixing means which enables the fitting groove to be fixed at least at one position along the guide rail.

Here, the precision substrates in the present invention includes singular or plural number (for example, 13 or 25 pcs.) of liquid crystal cells, silica glasses, semiconductor wafers (silicon wafers and the like), or mask substrates used in at least electric, electronic, or semiconductor production fields. When the precision substrate is a semiconductor wafer, semiconductor wafers having a large diameter (for example, 200 mm~300 mm or more) are naturally included. Moreover, the pod case or the pod door can be molded using resins such as polycarbonate (PC), acrylic resin, polybutylene terephthalate (PBT) or polypropylene (PP). Furthermore, according to need, antistatic treatment may be applied thereto. When the pod case is used as a 300 mm wafer carrier, the appearance of the pod case can be constructed in conformity to SEMI (Semiconductor Equipment and Materials International) Standard E47. 1-0097, and modified ballot.

Preferably, the bottom plate is molded using resins such as polypropylene, polycarbonate, or polybutylene terephthalate. The bottom plate may have a shape corresponding to the bottom face of the pod case, or have a plane in a roughly Y-shape or in a polygonal shape. Moreover, it is desired to mold the pocket body by using resins such as polycarbonate and polypropylene. The pocket body is preferably arranged at the other end portion or in the proximity of the bottom plate, from the viewpoint of parallel arrangement of a plurality of storage container for precision substrates or easiness of inserting/pulling out of the precision substrates. The pocket body may have an opening, an elbow, an inclined portion, a bending portion or the like, so far as it is a supporting structure substantially having a box shape. Moreover, a part of the pocket body may be transparent. Furthermore, the pocket body can be detachably disposed to the bottom plate, and in this case, architectural technique such as a dovetail connection method, a dovetail insertion method or a dovetail joint method can be properly used.

Moreover, the pocket body can be integrally formed, and in this case, the pocket body may be secured by integral forming, bonding using an adhesive, ultrasonic bonding, thermal bonding or the like. Furthermore, the pocket body can be formed in a horizontally slidable configuration or in a vertically undulatable configuration. In addition, the identification medium can be formed by using various resins other than the resins described above. As the identification medium, a board-shape plate provided with singular or plural number of bar codes or two-dimensional code such as QR code, various symbols, identification holes, or identification projections or the like on its surface by means of printing, adhesion or detachable adhesion may be used. However, the present invention is not limited thereto, and the input/output information may be increased by using a rewritable magnetic medium, IC or the like. Alternatively, a resonant ID tag sensor or the like may be used which stores the identification codes and status codes by utilizing the RF (Radio Frequency) signal, and receives and transmits the echo waves by using a rewritable transponder tag and electromagnetic radiation to confirm the identification codes.

Furthermore, when used as a 300 mm wafer carrier, the storage container for precision substrates can be utilized as an at least 300 mm carrier in the semiconductor production process, an interprocess carrier (FOUP), or a front opening shipping box (FOSB) for shipping.

According to the invention, if an identification medium is held in the pocket on the bottom plate, the precision substrate can be identified and recognized without adhering an identification code seal or the like on the storage container for precision substrates. Since there is no need of peeling off the identification code seal from the storage container for precision substrates, contamination of the precision substrates is not caused. Moreover, since the pocket is provided on the bottom plate having a relatively simple shape, the gate position being freely chosen, the structure of the mold is not made complicated.

Moreover, when the pocket body is not required, it can be omitted by removing from the bottom plate, and when the position or posture of the pocket body is to be changed, it can be properly shifted in the horizontal or vertical direction.

Furthermore, the identification portion on the front of the identification medium held in the pocket body is not directed downward where it is difficult to be viewed, and the identification portion can be recognized without changing the posture.

DESCRIPTION OF THE PREFERRED EMBODIMENTS

Figure 1:
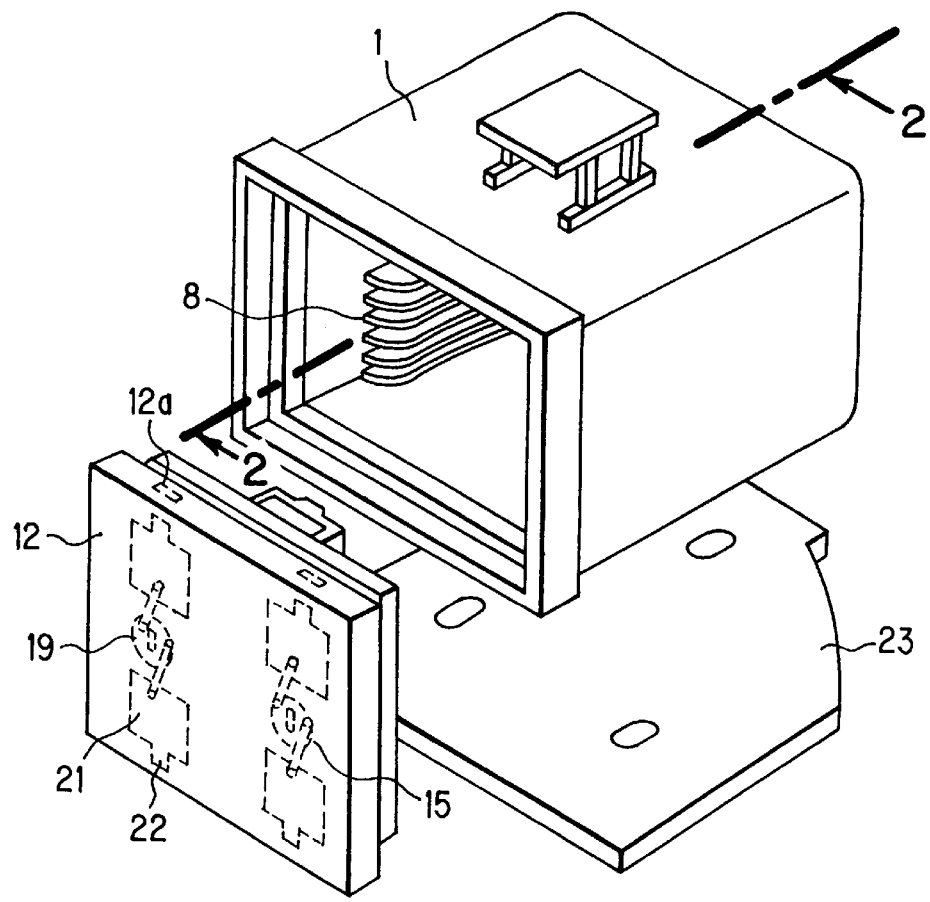
FIG. 1 is an exploded perspective view showing a conventional storage container for precision substrates.
Figure 2:
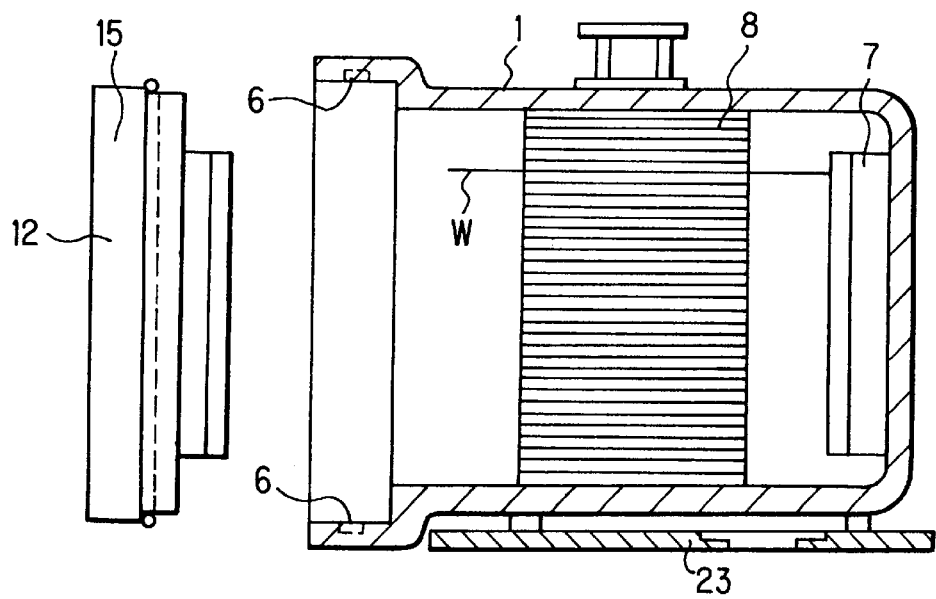
FIG. 2 is a sectional view taken along the line 2—2 in FIG. 1.
Figure 3:
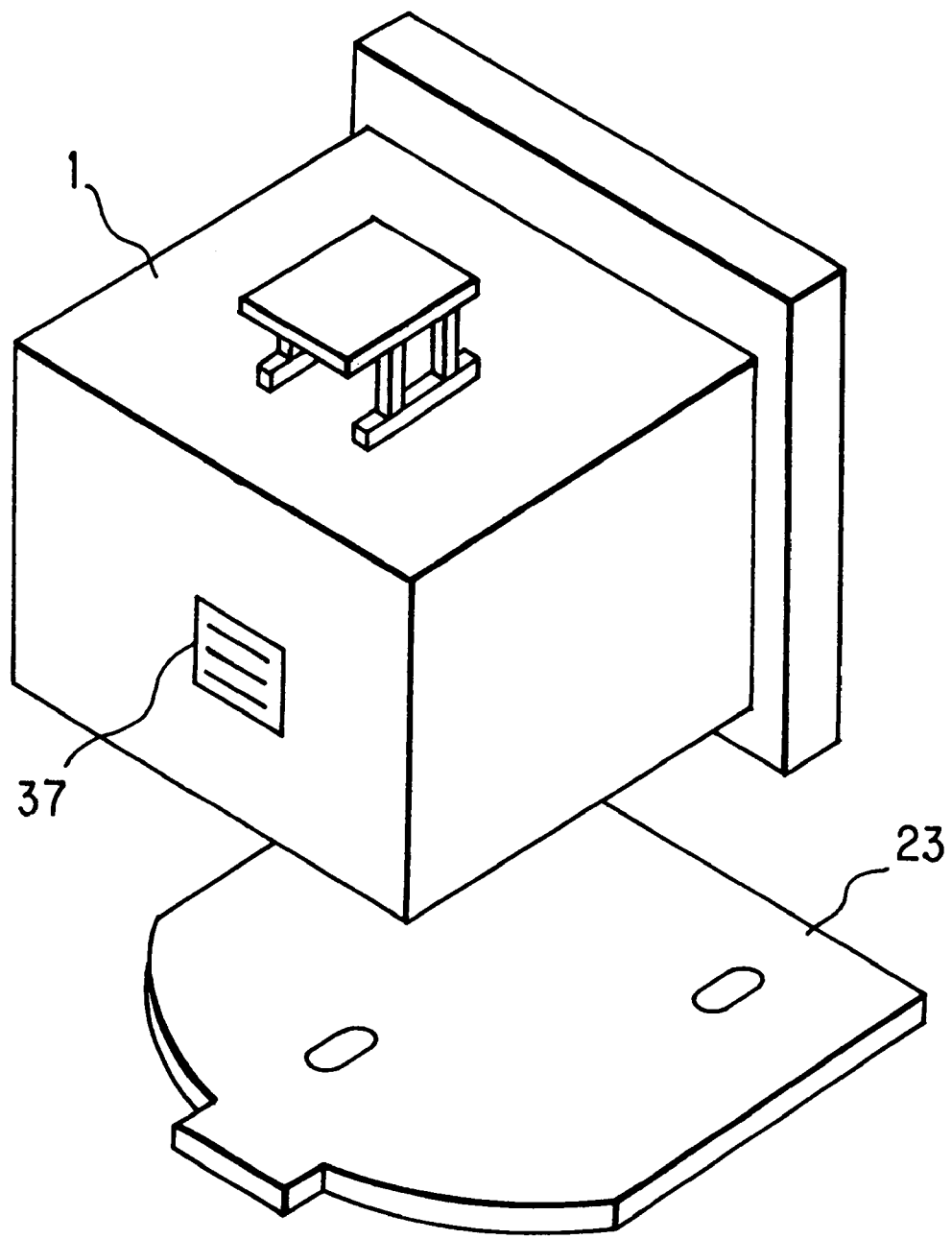
FIG. 3 is an exploded perspective view showing a state that an identification code seal is adhered on the pod case.
Figure 4:
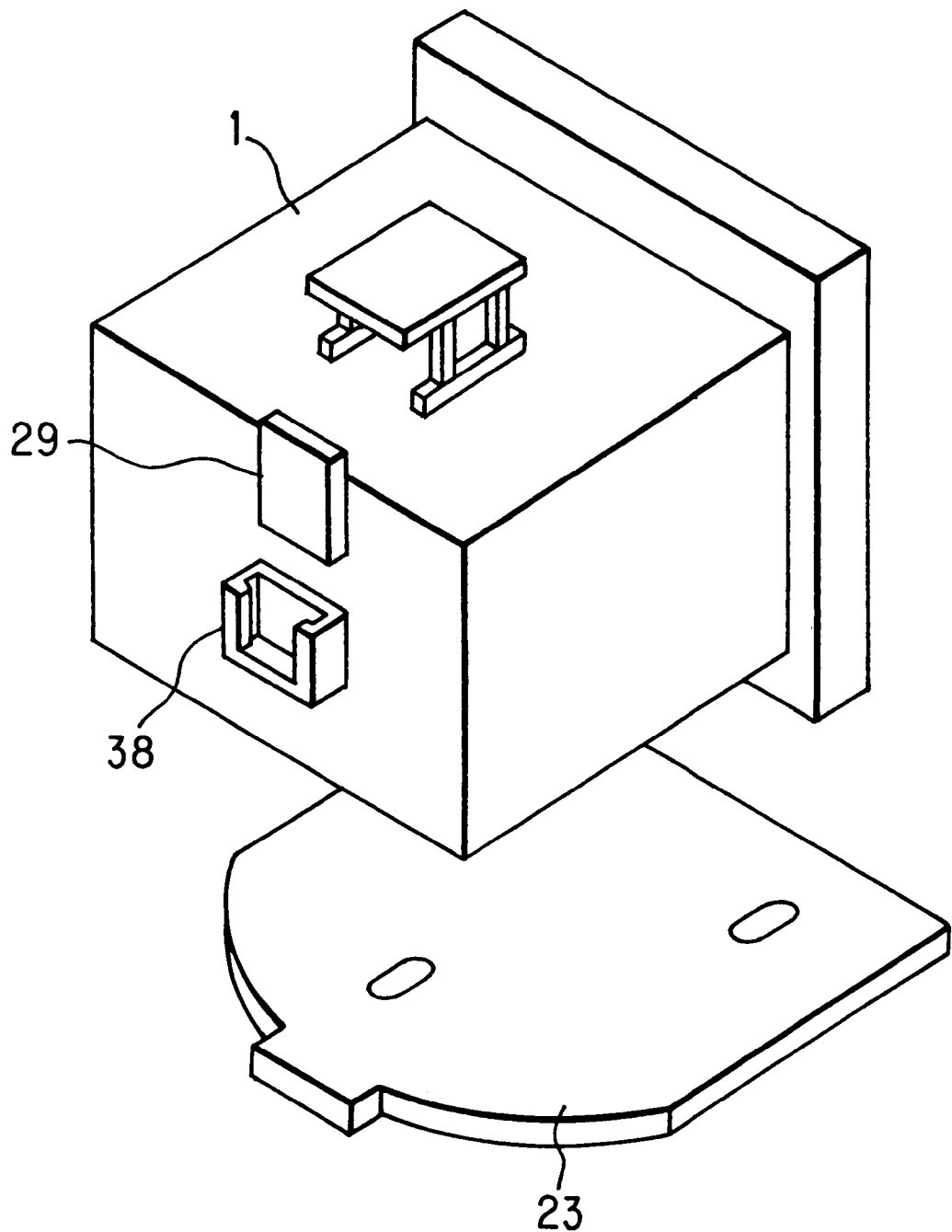
FIG. 4 is an exploded perspective view showing a state that a pocket is integrally formed on the pod case.

The embodiments of the present invention will now be described with reference to the accompanying drawings, but the present invention is by no means limited to these embodiments.

The storage container for precision substrates in this embodiment comprises, as shown in FIG. 5 to FIG. 10, a pod case 1 for aligning and accommodating a plurality of wafers W, a pod door 12 for detachably covering the opening front face of the pod case 1, a bottom plate 23 attached on the bottom face of the pod case 1, and a pocket body 27 formed at the other end portion of the bottom plate 23, and an identification plate 29 for wafers W is inserted upright in the pocket body 27 in such a manner that the identification plate can be interchanged.

Figure 5:
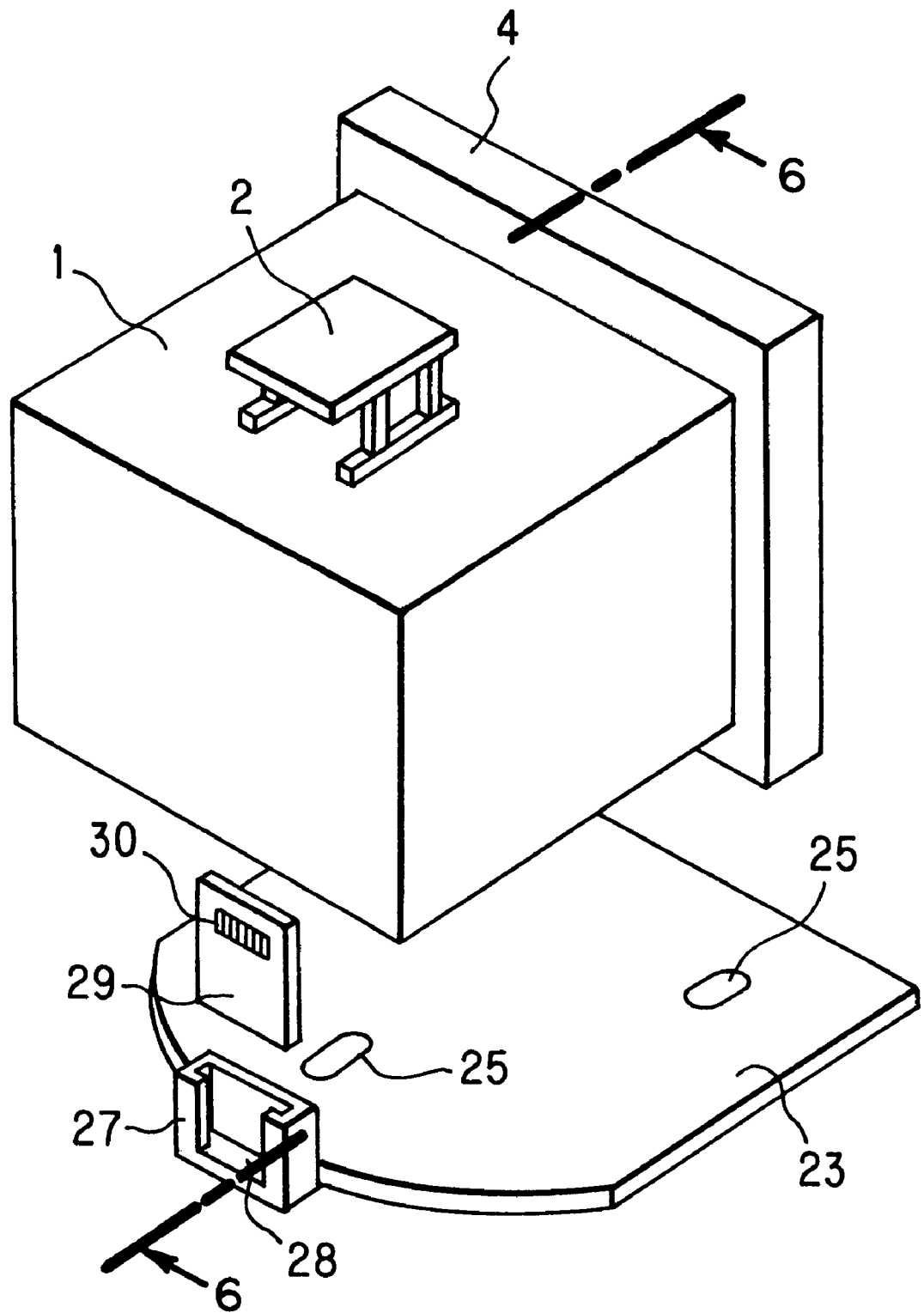
FIG. 5 is an exploded perspective view showing one embodiment of a storage container for precision substrates according to the present invention.
Figure 6:
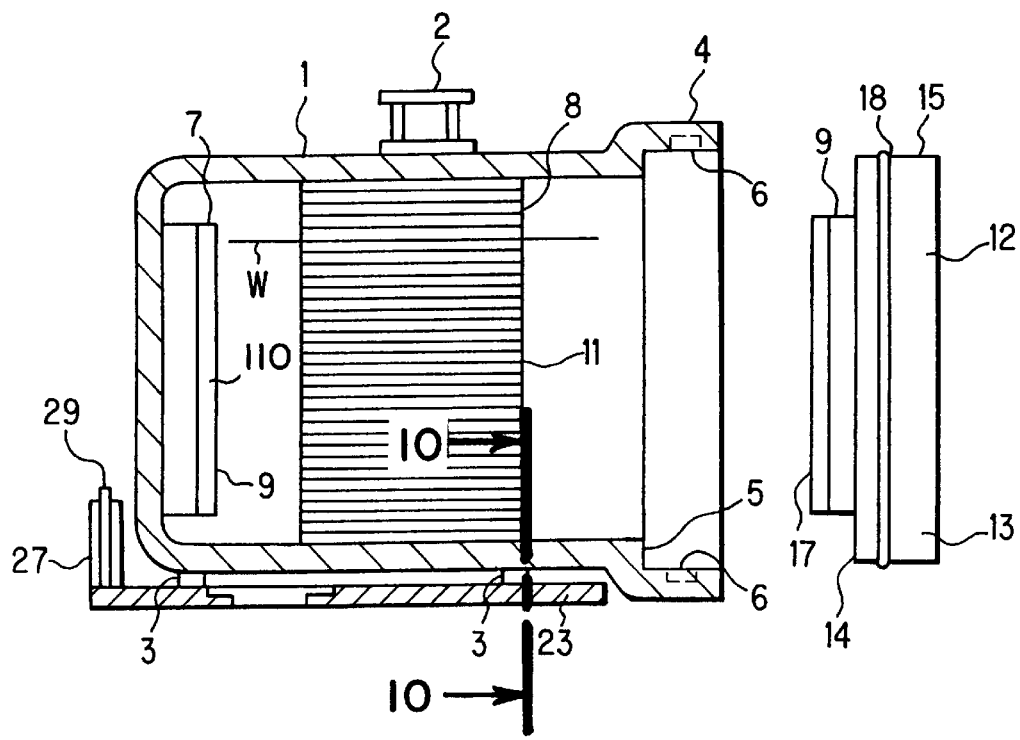
FIG. 6 is a sectional view taken along the line 6—6 in FIG. 5.

The pod case 1 is formed, as shown in FIG. 5, in a transparent front open box which can be seen through, by using a synthetic resin such as PC or the like which is light-weight and excellent in the moldability. The pod case 1 secures sufficient strength, rigidity and size stability so that it is not deformed, and guarantees normal operation of the automatic carrier apparatus such as AGV (Auto Guided Vehicle) or the like. On the center of the ceiling of the pod case 1, a robot flange 2 is screwed via a fastening member. The robot flange 2 is held by a ceiling carrier device, thereby the pod case 1 is carried. Moreover, on the bottom face of the pod case 1, a plurality of attachment bosses 3 having a cylindrical shape are formed in projections at predetermined intervals (see FIG. 10).

The periphery of the opening front face of the pod case 1 is formed in folding with an expanded state to form a rim 4, and an inner stepped face of the rim 4 forms a seal face 5 (see FIG. 5). On the upper and lower sides of the inner peripheral face of the rim 4, a plurality of engagement holes 6 (in this embodiment, in total 4 holes) are formed in a recessed state at predetermined intervals, respectively. On the both sides of the pod case 1, unillustrated side handles may be detachably disposed, respectively, for manual conveyance.

Figure 9:
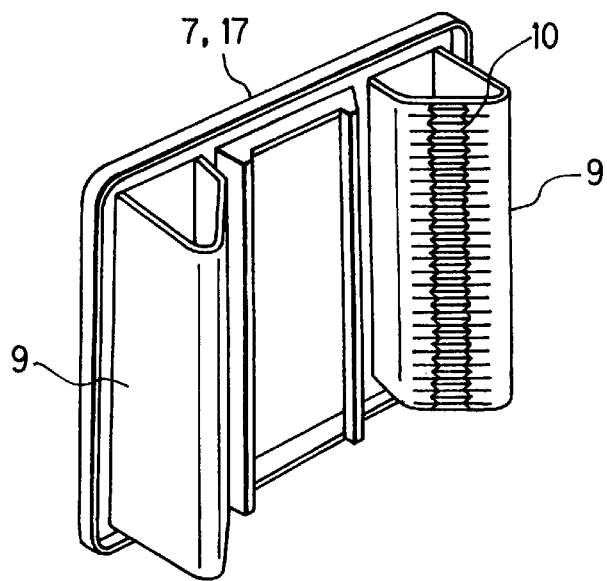
FIG. 9 is a perspective diagram showing a front retainer and a rear retainer in the embodiment of the storage container for precision substrates according to the present invention.
Figure 10:
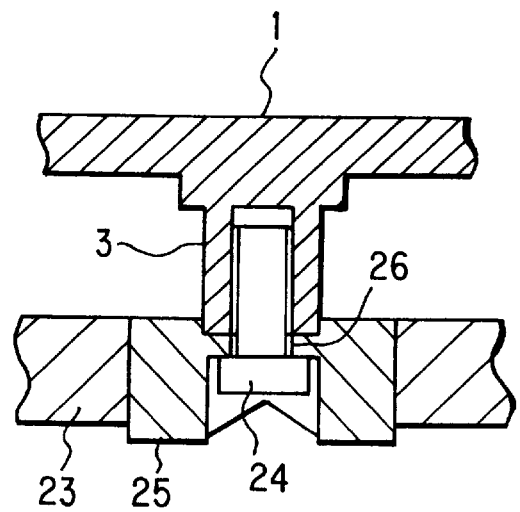
FIG. 10 is a sectional view taken along line 10—10 in FIG. 6 showing the relation between the pod case and the bottom plate in the embodiment of the storage container for precision substrates according to the present invention.

As shown in FIG. 5 and FIG. 9, on the inner back face of the pod case 1, a rear retainer 7 is detachably disposed and fixed, and on the inner both sides of the pod case 1, a pair of opposing substrate supports 8 are detachably disposed, respectively. The rear retainer 7 may be formed from materials having less contamination and excellent elasticity, such as various thermoplastic elastomers, polyethylene, polypropylene or the like, more preferably, from a viewpoint of bending elasticity, a polyester-type elastomer having a modulus of elasticity in bending of from 5,000 to 15,000 $kg/cm^2$ (ASTIM D790) is used as a forming material to be formed in a board shape.

On both sides of the surface of the rear retainer 7, a cushion portion 9 is formed in an expanded state, and on an opposing inclined plane of each cushion portion 9, a plurality of holding slots 110 (for example, 25 slots) having a section in a V-shape which elastically hold the periphery of wafers W are provided in proximity in a row arrangement in the vertical direction. Moreover, each substrate support 8 is formed basically in a board shape, using a similar forming material as that of the rear retainer 7. On each substrate support 8, there are also provided in proximity in a row arrangement in the vertical direction a plurality of supporting slots 11 (for example, 25 slots) having a section in a V-shape which elastically holds the periphery of wafers W. The plurality of supporting slots 11 are formed at the same pitch as that of the plurality of holding slots 10, for horizontally supporting the plurality of wafers W and aligning them in the vertical direction.

Figure 7:
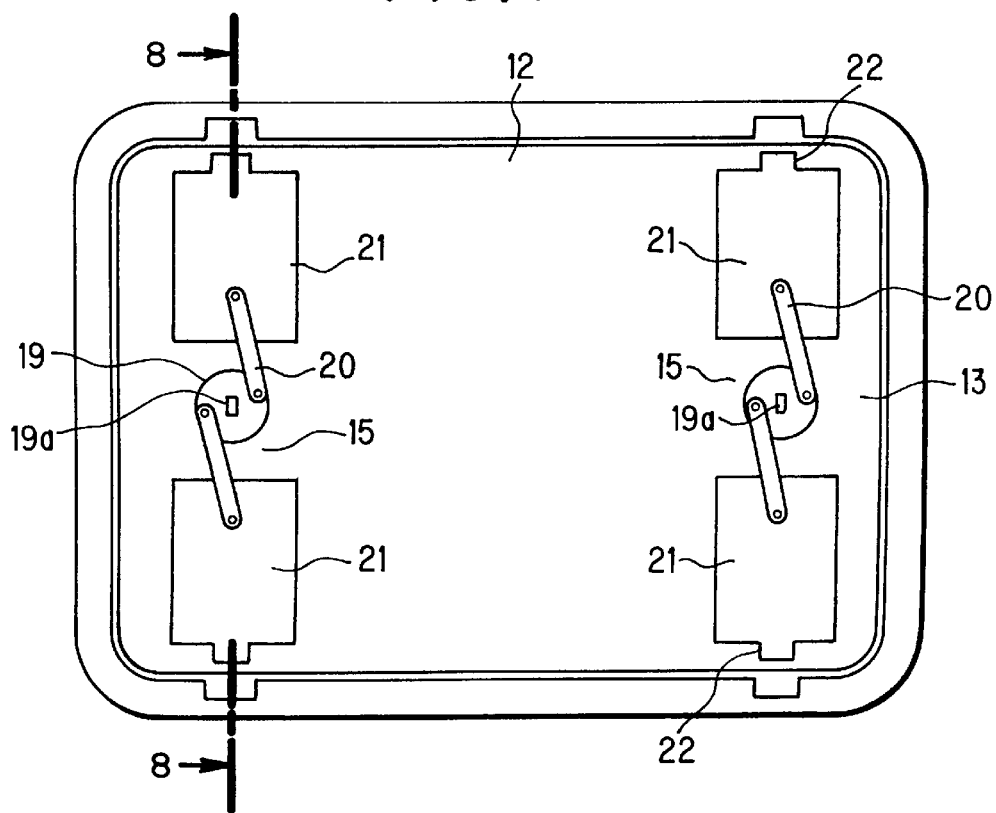
FIG. 7 is a diagram illustrating the pod door in the embodiment of the storage container for precision substrates according to present invention.
Figure 8:
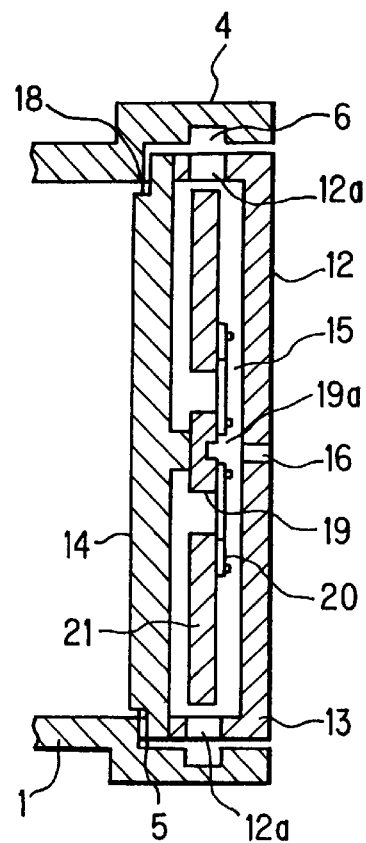
FIG. 8 is a sectional view taken along the line 8—8 in FIG. 7.

With regard to the pod door 12, as shown in FIG. 7 and FIG. 8, an outside plate 13 and an inside plate 14 formed by using the similar synthetic resin as the pod case 1 are opposing with each other, and an inner lock type opening/closing lock mechanism 15 is incorporated in between these plates. On both sides of the surface of the outside plate 13, a pair of keyholes 16 for the opening/closing lock mechanism 15 is respectively pierce-formed at an interval, and the opening/closing lock mechanism 15 is operated by means of the pair of keyholes 16.

A front retainer 17 having the same configuration as and opposing the rear retainer 7 is detachably disposed on the inside plate 14. On the inside plate 14, a frame-like door seal 18 is detachably fitted via a protrusion, groove or the like, which is pressed against the seal face 5 of the rim 4 to be sealed at the time of fitting the pod door 18 to cover the opening of the pod case 1. The door seal 18 is formed as a gasket, using various thermoplastic elastomers such as polyolefin type or polyester type, or fluorine rubbers or silicone rubbers. Preferably, forming is made with materials having less evaporation of organic components which contaminate the wafers W, and having a hardness of not more than 80° as measured according to JIS K6301A.

The opening/closing lock mechanism 15 comprises, for example as shown in FIG. 7 and FIG. 8, a pair of disks 19 which are supported rotatably by means of a shaft in a convex portion on both sides on the inner face of the inside plate 14 and opposing the keyholes 16, and a plurality of latch plates 21 coupled to the outer periphery of each disk 19 via oscillating pins 20. The disks 19 are formed substantially in a U-shape in the section, and holes 19a in the center thereof are used at the time of locking and unlocking. Moreover, respective latch plates 21 are located on both sides of the upper and lower sides inside of the pod door 12. From the tip of the latch plate, an engagement pawl 22 projects, respectively, for passing through a through hole 12a on the outer periphery of the pod door 12 in an exposed state, and the engagement pawl 22 is fitted together and pulled apart against the engagement hole 6 in the rim 4.

The bottom plate 23 is formed using synthetic resins such as PP, PC or PBT, and screwed in a plurality of attachment bosses 3 on the bottom face of the pod case 1 via a fastening member 24. The bottom plate 23 is formed in a board shape corresponding to the bottom face of the pod case 1, such that the other end portion which is the back side (the left side in FIG. 6) curves in a roughly semi-arc shape in the plane, or the bottom plate may be formed in a polygonal shape and the other end portion may be formed in a straight shape. On both sides of the front part and on the rear part of the bottom plate 23, a positioning member 25 comprising a kinematic coupling is detachably fitted, respectively, and a screw hole 26 is bored in each positioning member 25, consequently, each screw hole 26 and each attachment boss 3 are screwed together via the fastening member 24. Each positioning member 25 is formed using materials having excellent wear resistance, such as PP, PC, PBT, PEEK or PEI, and functions such that it positions storage container for precision substrates and various semiconductor production devices such as the handling apparatus.

Preferably, the bottom plate 23 and the plurality of positioning members 25 (in this embodiment, in total 3) are detachably arranged separate bodies with respect to each other, but they may be integrally formed. In addition, the attached position of each positioning member 25 is determined based on the SEMI Standard.

The pocket body 27 is also integrally formed with the bottom plate 23, using synthetic resins such as PP and PC, and arranged in a standing condition in the center of the other end portion of the bottom plate 23, adjacent to the back face of the pod case 1. The pocket body 27 is formed in a thin box shape with the upper face opened, in other word, in a roughly letter rack shape, with a rectangular reading area 28 being formed as an opening on the standing plane of the surface. Via the reading area 28, an identification code 30 of an identification plate 29 having a board shape is read by unillustrated ID reader.

In the above configuration, when the wafers W are accommodated, a plurality of sliced wafers W are first aligned and accommodated in the pod case 1 via the rear retainer 7 and the pair of substrate supports 8, and the pod door 12 is fitted to the opening front of the pod case 1, as well as the holding slots 10 of the front retainer 17 are pressed against the plurality of wafers W and the opening/closing lock mechanism 15 are operated to be locked by unillustrated pod opener. Then, each disk 19 of the opening/closing lock mechanism 15 rotates to project each latch plate 21 outward via the oscillating pin 20 so that the engagement pawl 22 of each latch plate 21 projects through the through hole 12a of the pod door 12 to be fitted to and engage with each engagement hole 6, thereby the pod door 12 is firmly fitted and coveringly attached in an airtight state to the front face of the pod case 1.

When the accommodation operation of the plurality of wafers W is completed, the identification plate 29 is inserted from upper side into the pocket body 27 with a clearance in an upright state. Thus, the wafers W and various information of the storage container for precision substrates can be controlled. Moreover, when the storage container for precision substrates is reused, the identification plate 29 in which a new identification code 30 is input has only to be inserted in the pocket body 27 with a clearance in an upright state.

According to the above configuration, since there is no need of peeling off the identification code seal 37 from the surface of the wafers W, the problem of contamination of the surface of the wafers W can be easily solved. Moreover, since there is no need of extending the cleaning time or rejecting inferior products, the productivity is not decreased. Furthermore, the identification plate 29 has only to be inserted in the pocket body 27, hence it can be reused very easily. In addition, unlike the conventional pod case, the bottom plate 23 having a simple shape with the gate position being freely chosen and the pocket body 27 are integrally formed, hence injection molding is possible without any problem, thus it is reliably prevented for the mold structure from becoming complicated, and the cost can be maintained and controlled.

Furthermore, since the pocket body 27 is not formed on the back of the pod case 1, there is no limitation for the position of the gate and no decrease in the number of gates, thus deterioration of the molding condition can be effectively prevented. In addition, since there is no need of forming the mold in a special nesting configuration, stabilization of cooling and prevention of occurrence of inferior products can be expected, without decreasing the durability. Moreover, since the pocket body 27 is standing up in the vertical direction, the identification plate 29 is not inclined toward the back side, so that reading of the data of the identification code 30 on the surface of the identification plate 29 becomes very easy.

Moreover, when the pod case 1 which accommodates the wafers W is applied as a shipping container and a transportation container, the front retainer 17 and the rear retainer 7 hold the peripheral part of the front and back of the wafers W, hence bad influence of vibration to the wafers W can be effectively eliminated, and damage to the wafers W can be effectively prevented. In addition, when a pair of substrate supports 8 which are separate parts are used to make each substrate support 8 detachable, they are formed in a simple and small shape by using resins having excellent formability, hence occurrence of dimentional instability due to warpage can be prevented.

Furthermore, when the pod case 1, the substrate supports 8, the front retainer 17, and the rear retainer 7 are subjected to the antistatic treatment, or electric conductivity is imparted to them, it becomes possible to prevent adhesion of dust due to the static electricity, to prevent contamination of wafers W, and to largely improve the yield. In addition, since the rear retainer 7, the substrate supports 8, the front retainer 17, the bottom plate 23 and the like can be made replaceable, when contamination or wear of parts is concerned, the contaminated or worn part has only to be replaced or cleaned. Hence, the pod case 1 can be cleaned and reused in any number of times, as well as decrease in the number of discarded parts can be expected.

Figure 11:
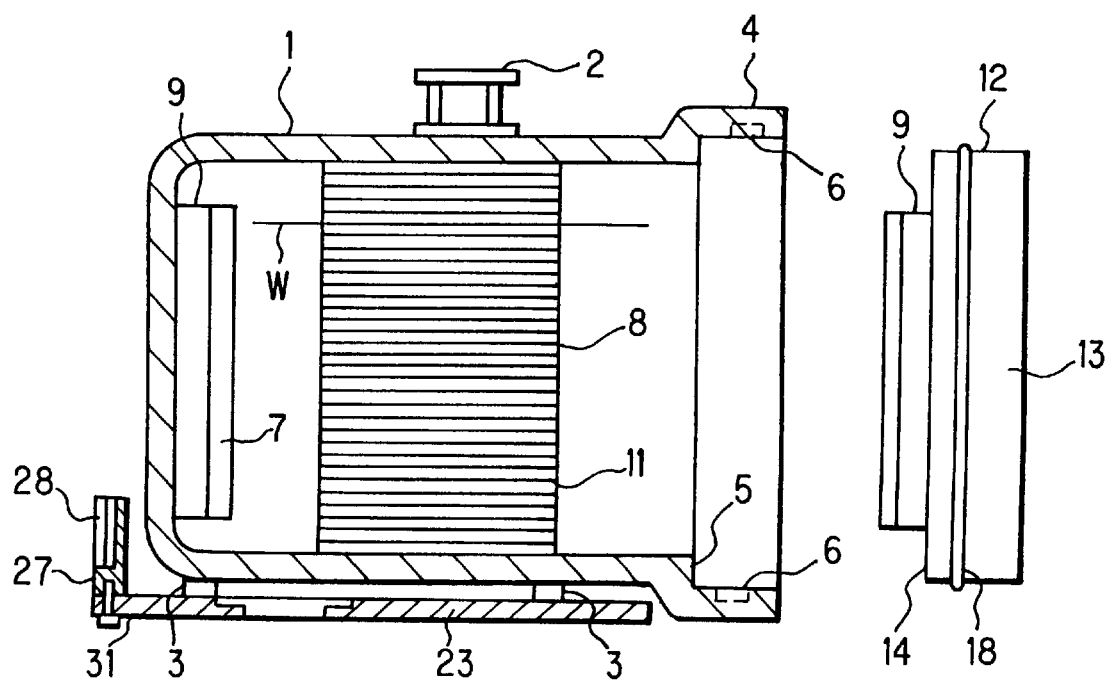
FIG. 11 is a sectional view taken along line 11—11 in FIG. 12 showing the second embodiment of the storage container for precision substrates according to the present invention.
Figure 12:
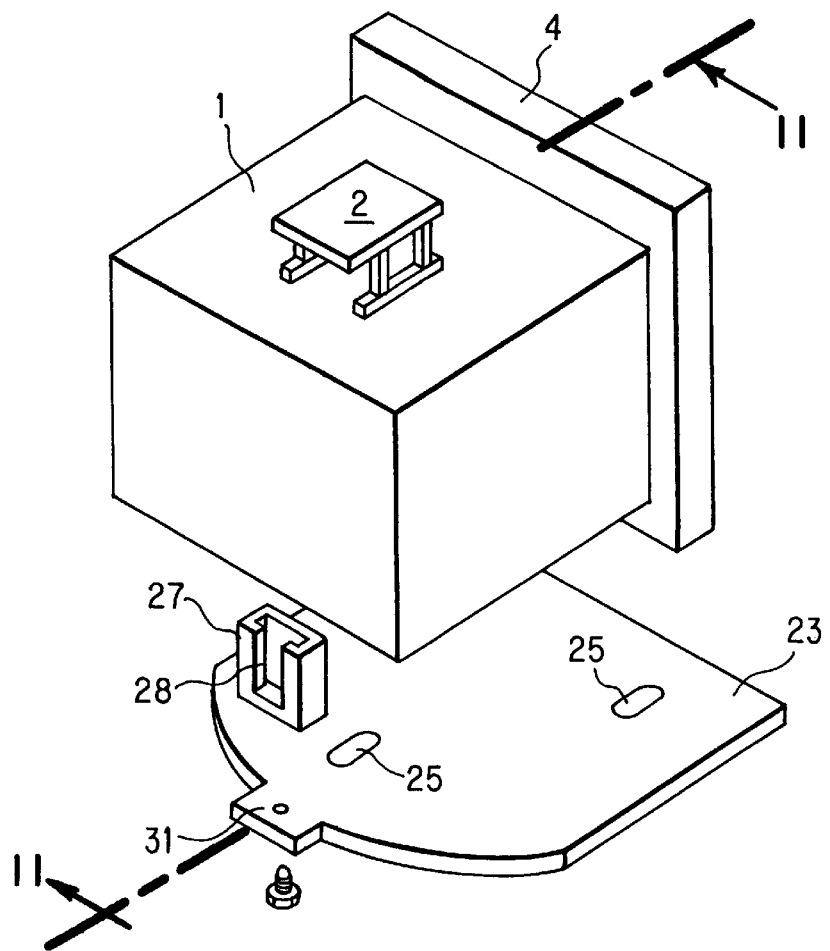
FIG. 12 is an exploded perspective view showing the second embodiment of the storage container for precision substrates according to the present invention.

FIG. 11 and FIG. 12 show the second embodiment. In this case, the center of the other end portion of the bottom plate 23 is formed in a projection as an attachment seat 31 with a rectangular shape, and separate pocket body 27 is detachably screwed in the attachment seat 31 via a fastening member so that the pocket body 27 stands up. Other parts are the same as those of the above embodiment, and their explanation will be omitted.

In this embodiment, the similar effects as those of the above-mentioned embodiment can be expected, and when the pocket body 27 is not required, it is obvious that the pocket body 27 can be easily removed by loosening the fastening member.

Figure 13:
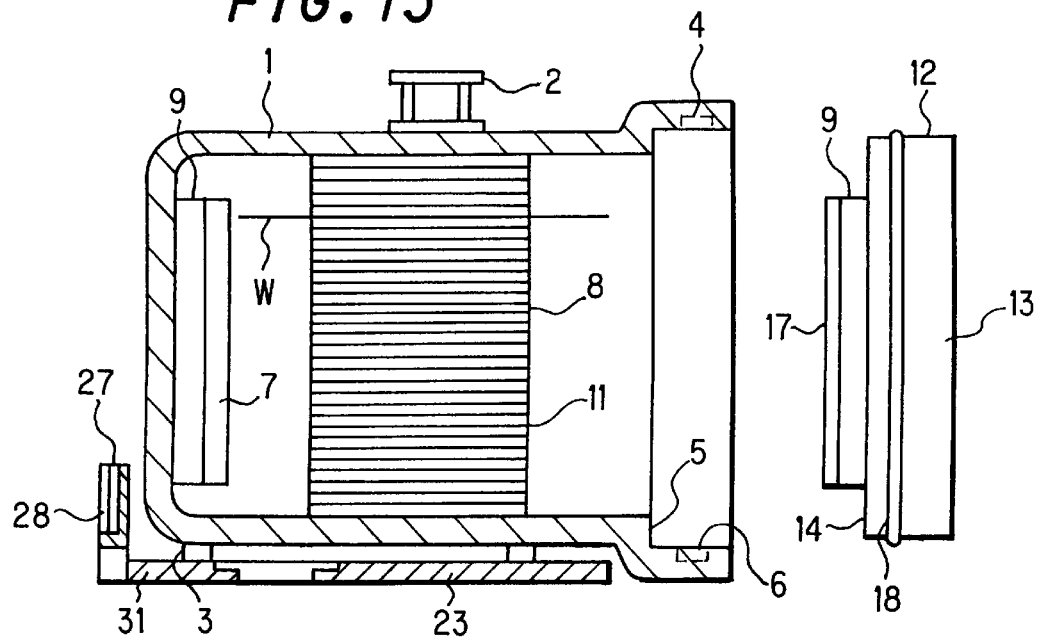
FIG. 13 is a sectional view taken along line 13—13 in FIG. 14 showing the third embodiment of the storage container for precision substrates according to the present invention.
Figure 14:
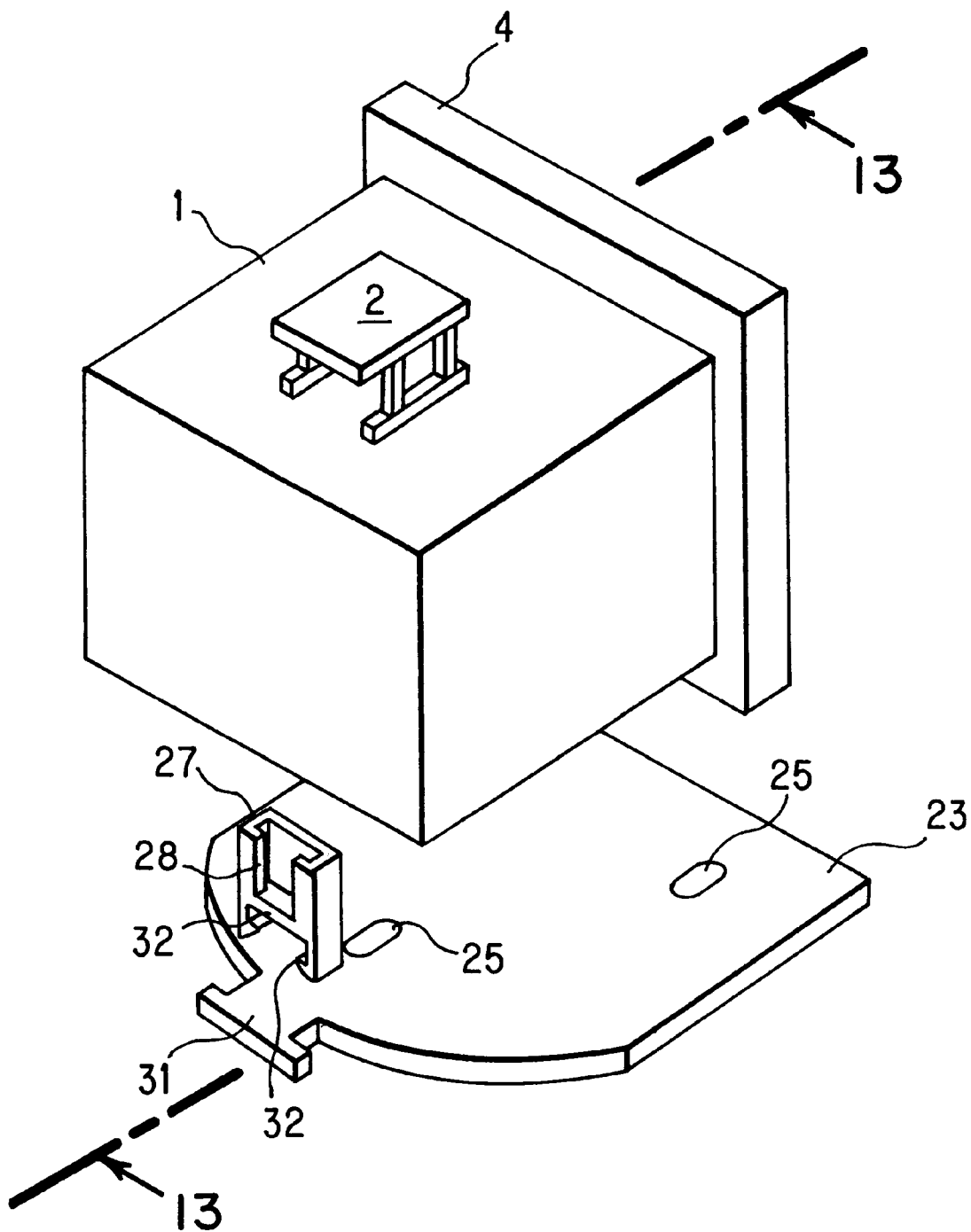
FIG. 14 is an exploded perspective view showing the third embodiment of the storage container for precision substrates according to the present invention.

FIG. 13 and FIG. 14 show the third embodiment. In this case, the center of the other end portion of the bottom plate 23 is formed in a projection as an attachment seat 31 in a roughly T-shape in the plane. The pocket body 27 is made as a separate part, as well as the lower part of the pocket body 27 is formed in a roughly reverse U-shape. On the both free ends thereof, a holding pawl 32 is bent inwardly, respectively, to elastically hold the attachment seat 31 vertically and detachably from the upper side at the lower part of the pocket body 27. Other parts are the same as those of the above embodiments, and their explanation will be omitted.

In this embodiment, the similar effects as those of the above-mentioned embodiments can be also expected, and a fastening member such as a screw or the like is not required. Hence, it is obvious that the number of parts can be reduced, that the configuration can be made simple, and that the workability can be improved.

Figure 15:
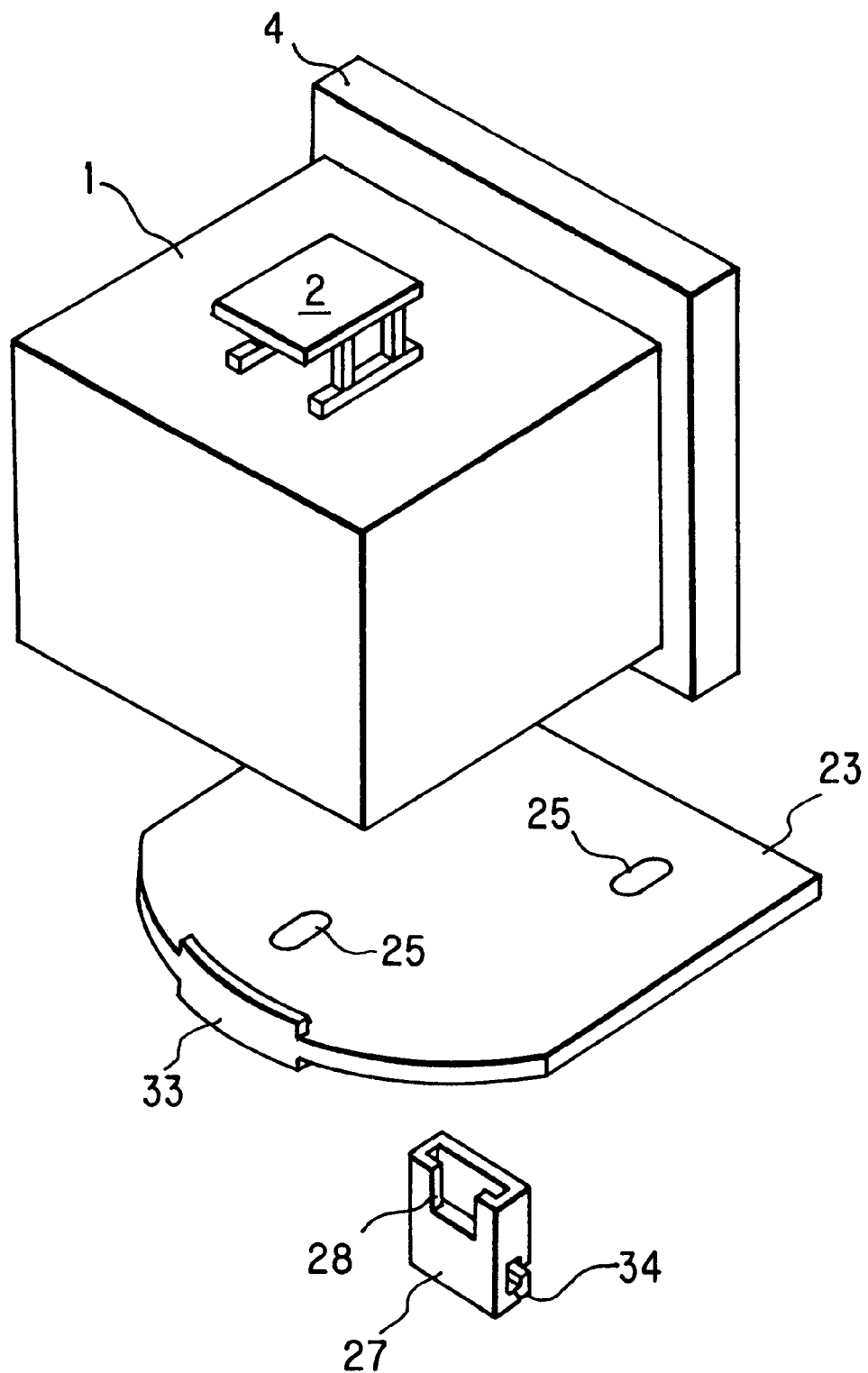
FIG. 15 is an exploded perspective view showing the fourth embodiment of the storage container for precision substrates according to the present invention.

FIG. 15 shows the fourth embodiment of the present invention. In this case, the center of the other end portion of the bottom plate 23 is formed in an expanded state as a guide rail 33 having a plane in a roughly semi-arc shape. The pocket body 27 is made as a separate part, as well as a fitting groove 34 having a vertical section in a roughly C-shape is notched in the horizontal direction on the lower back face of the pocket body 27, so that the pocket body 27 can be inserted slidably in the guide rail 33 via the fitting groove 34. Other parts are the same as those of the above embodiments, and their explanation will be omitted.

In this embodiment, the similar effects as those of the above-mentioned embodiments can be also expected, and when the position of the pocket body 27 is desired to be changed slightly, it becomes possible to easily shift the pocket body 27 in the horizontal direction, guided by the guide rail 33.

Figure 16A:
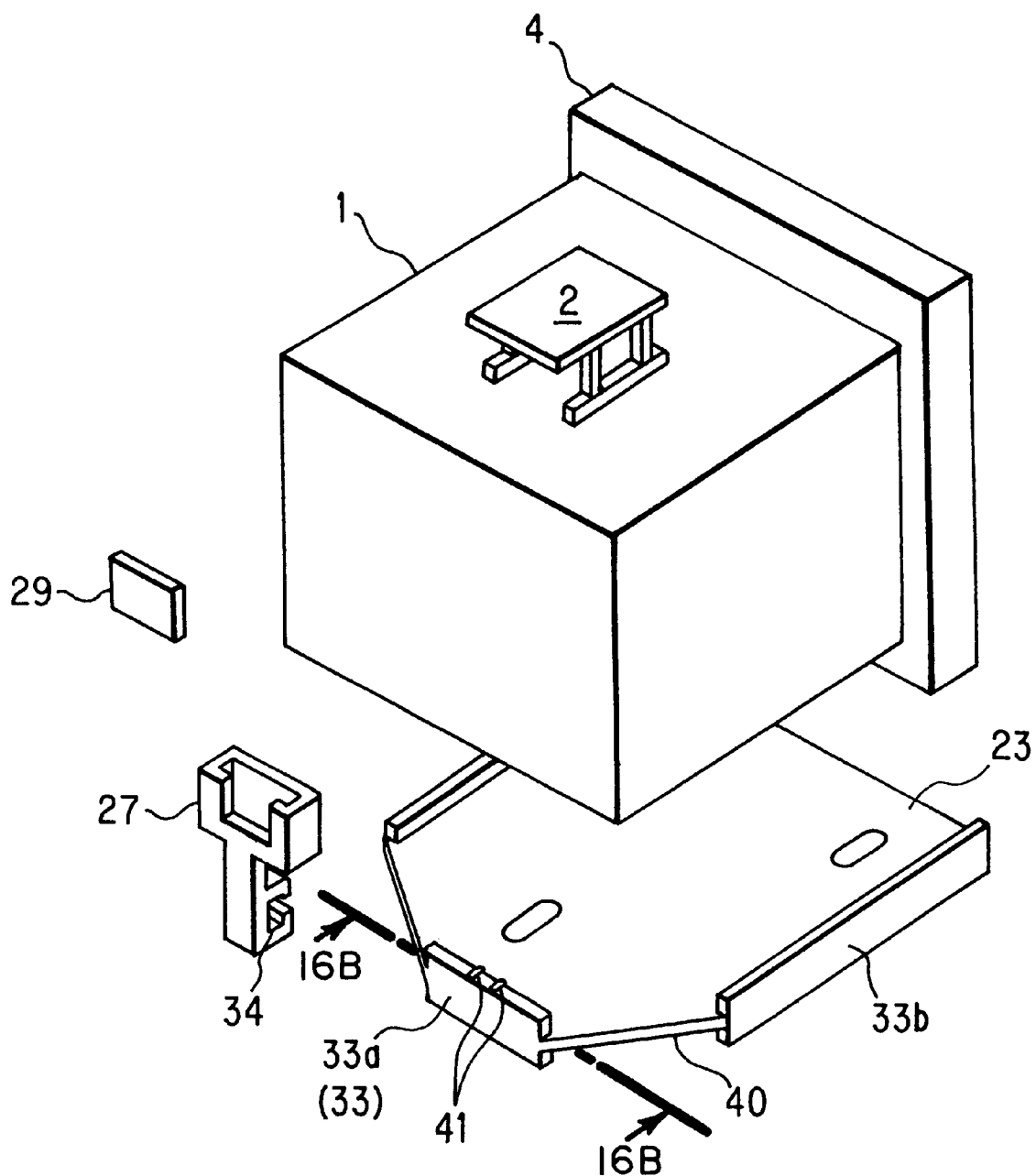
FIG. 16A is an exploded perspective view showing alternative embodiment of the fourth embodiment of the storage container for precision substrates according to the present invention.
Figure 16B:
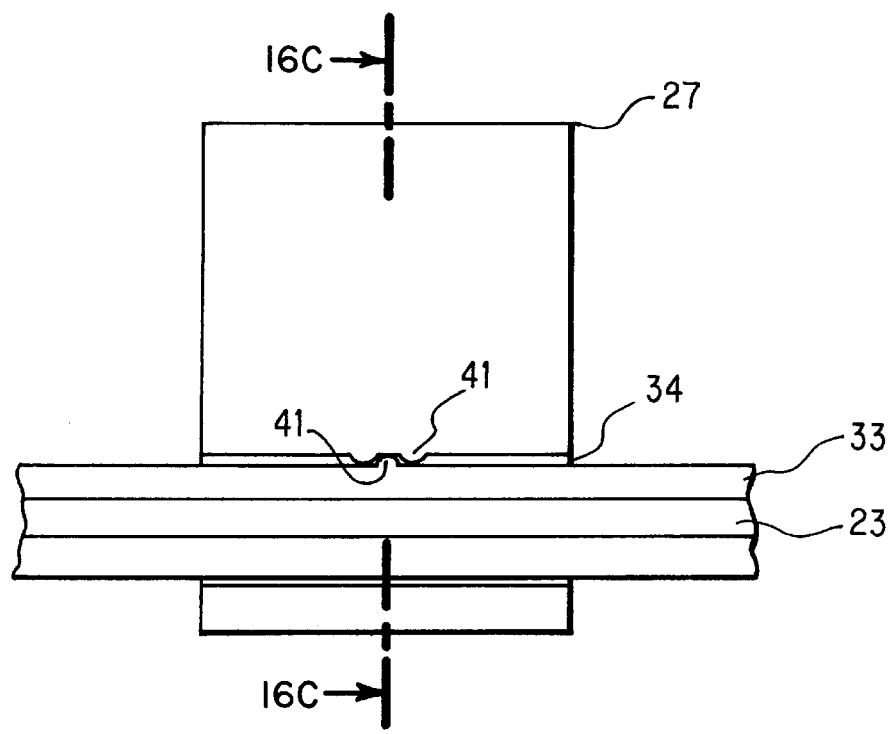
FIG. 16B is a sectional view taken along the line 16B—16B in FIG. 16A
Figure 16C:
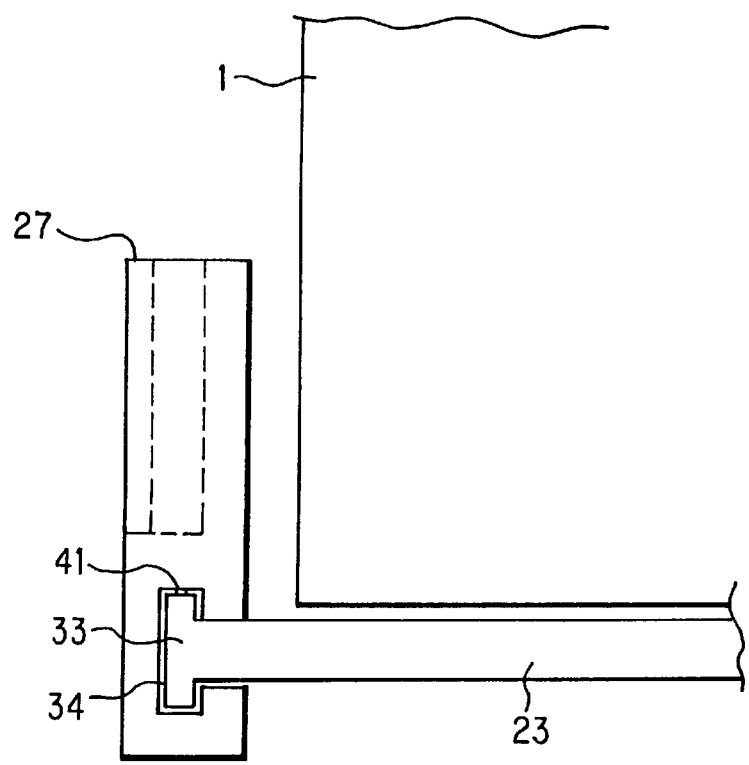
FIG. 16C is a sectional view taken along the line 16C—16C in FIG. 16B.

In FIG. 15, the other end portion of the bottom plate 23 is formed in an arc shape with the guide rail 33, but the present invention is not restricted thereto. As another embodiment, as shown in FIG. 16A~FIG. 16C, the bottom plate 23 is formed in a polygonal shape, and rims 33a, 33b for reinforcement are provided, projecting in at least one vertical direction substantially along the whole outer periphery, and the rim 33a may be used as a guide rail 33. FIG. 16A is an exploded perspective view showing alternative embodiment of the fourth embodiment of the present invention, FIG. 16B is a sectional view taken along the line 16B—16B in FIG. 16A and FIG. 16C is a sectional view taken along the line 16C—16C in FIG. 16B.

In this case, discontinuities 40 may be provided in a part of the rim 33a, 33b, so that the pocket body 27 can be put in and pulled out from the guide rail 33.

Thus, by making the end portion of the bottom plate 23 straight shape, it becomes easy to form the fitting groove 34 in the pocket body 27, and insertion in the guide rail 33 becomes also easy.

Moreover, by providing an engagement protrusion 41 formed in a spherical shape on at least one of the inner periphery of the fitting groove 34 of the pocket body 27 or the pocket body engagement position on the guide rail 33, the pocket body 27 can be firmly engaged in the guide rail 33.

Furthermore, by providing the engagement protrusions 41 in a plurality of positions on the guide rail 33, the engagement position of the pocket body 27 can be changed.

Figure 17:
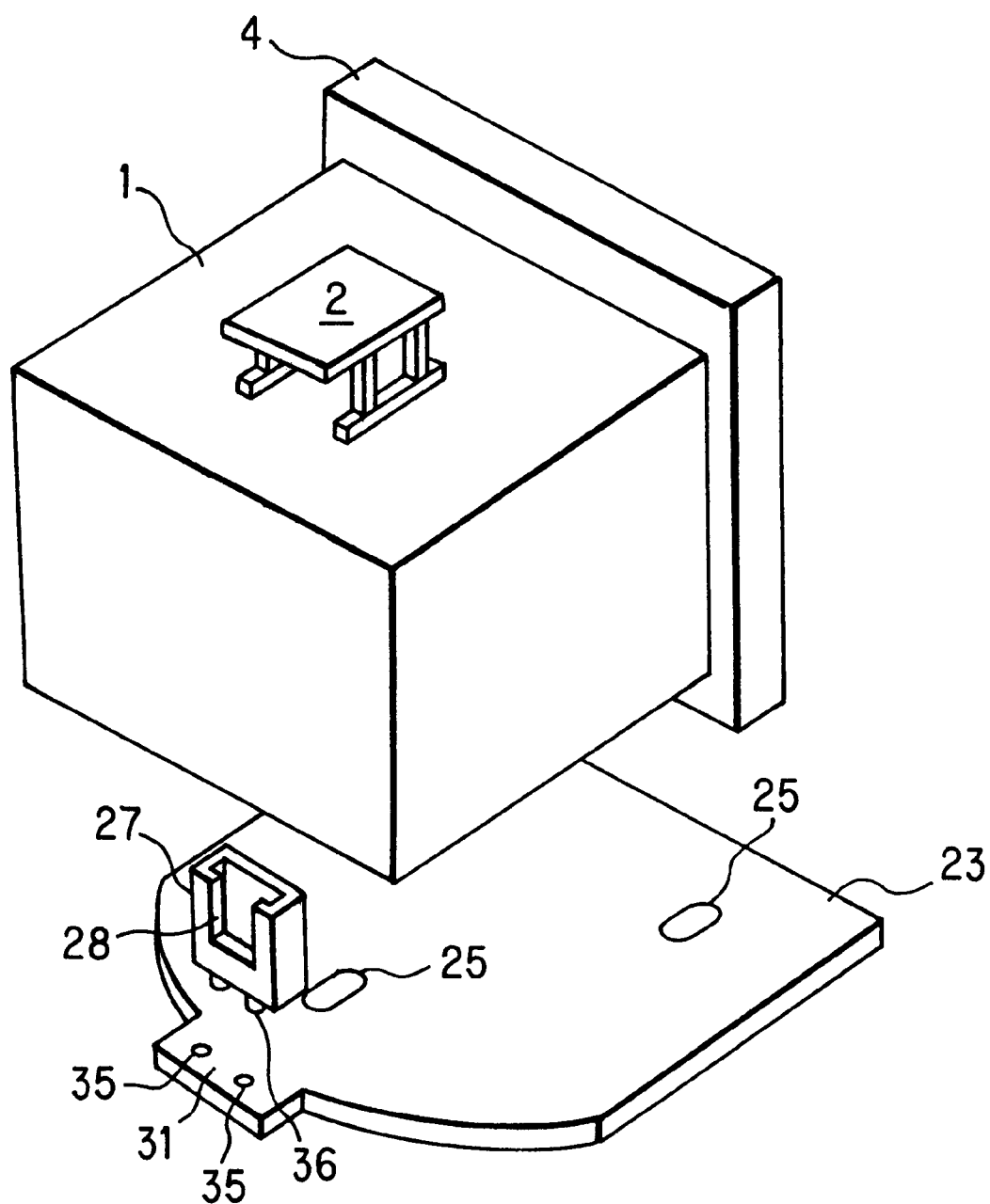
FIG. 17 is an exploded perspective view showing the fifth embodiment of the storage container for precision substrates according to the present invention.

FIG. 17 shows the fifth embodiment of the present invention. In this case, the center of the other end portion of the bottom plate 23 is formed in a projection as an attachment seat 31 in a rectangular shape, and a pair of insertions holes 35 is bored in parallel on the attachment seat 31. The pocket body 27 is made as a separate part, as well as a pair of insertion pins 36 are formed as projection in parallel on the bottom face of the pocket body 27, so that the pocket body 27 can be detachably disposed by insertion via insertion holes 35 and insertion pins 36 in a standing condition. Other parts are the same as those of the above embodiments, and their explanation will be omitted.

In this embodiment, the similar effects as those of the above-mentioned embodiments can be also expected, and a fastening member is not required. Hence, the number of parts can be reduced, the configuration can be made simple, and the workability can be improved.

In the above embodiments, engagement holes 6 are formed in a plural number on the upper and lower sides on the inner periphery of the rim 4, respectively, but the present invention is not limited thereto. For example, engagement holes 6 may be formed in a plural number on the right and left sides on the inner periphery of the rim 4, respectively. Moreover, the opening/closing lock mechanism 15 may be changed corresponding thereto. In addition, in the above embodiments, it is shown that supporting slots 11 and holding slots 10 having a section in a V-shape are formed on the substrate supports 8, the front retainer 17 and the rear retainer 7, respectively, but supporting slots 11 and holding slots 10 having a section in a U-shape may be formed, respectively. Furthermore, the substrate supports 8, the front retainer 17 and/or the rear retainer 7 may be formed in an integral fixed structure which cannot be detached.

Furthermore, the compression strength of the front retainer 17 and that of the rear retainer 7 may be made the same or different, or the same material is used and the compression strength may be changed by means of a filler such as a glass fiber or the like. In particular, when the compression strength of the rear retainer 7 is made larger than that of the front retainer 17, a repulsion force does not act on the wafers W every time when the pod door 12 is opened and the front retainer 17 is removed. As a result, it can be effectively prevented that the wafers W move forward to shift the position, or the wafers W are damaged.

As described above, such effects can be obtained that contamination of precision substrates and drop of the productivity can be effectively prevented, and the quality of the precision substrates can be maintained. Moreover, when the storage container for precision substrates is produced by molding, it can be prevented to make the mold structure complicated or to make cooling unstable, as well as occurrence of inferior products can be suppressed and prevented. Furthermore, even if the storage container for precision substrates is reused, since the identification medium is attached to the storage container for precision substrates, the usage condition can be controlled.

What is claimed is:

1. A storage container for precision substrates comprising:
   one opening end face of a pod case for accommodating precision substrates, said opening end face coverable with a pod door;
   a bottom plate provided on a bottom face of said pod case;
   a pocket body provided on the bottom plate and located at an end portion of said bottom plate opposite to said opening end face of said pod case;

said bottom plate and said pocket body being separately formed;

said pocket body being detachably connected to said bottom plate;

a guide rail being provided on at least a portion of a periphery of said bottom plate opposite to the opening end face of said pod case;

a fitting groove being provided on said pocket body so that said guide rail is engaged with said fitting groove to arrange said pocket in a standing condition; and said pocket body holding an identification means for said precision substrates.

2. A storage container for precision substrates according to claim 1, wherein said pocket body is formed in a substantially box shape with the upper face being opened, and a reading area for the identification medium is formed in the standing plane thereof.

3. A storage container for precision substrates according to claim 1, wherein said pocket body is provided with a fitting groove which is able to be attached shiftably to said guide rail, and said fitting groove is further provided with a fixing means which enables said fitting groove to be fixed at least at one position along said guide rail.

4. A storage container for precision substrates according to claim 2, wherein said pocket body is provided with a fitting groove which is able to be attached shiftably to said guide rail, and said fitting groove is further provided with a fixing means which enables said fitting groove to be fixed at least at one position along said guide rail.

* * * * *